United States Patent [19]

Lee et al.

[11] Patent Number: 5,493,530

[45] Date of Patent: Feb. 20, 1996

[54] RAM WITH PRE-INPUT REGISTER LOGIC

[75] Inventors: Tsu-wei F. Lee, Monte Sereno; Richard J. Zeman, Santa Clara; Thinh D. Tran, Milpitas; Y. S. Kao, Cupertino, all of Calif.

[73] Assignee: Paradigm Technology, Inc., San Jose, Calif.

[21] Appl. No.: 425,666

[22] Filed: Apr. 17, 1995

Related U.S. Application Data

[63] Continuation of Ser. No. 112,409, Aug. 26, 1993, abandoned.

[51] Int. Cl.$^6$ .................................................. G11C 7/00
[52] U.S. Cl. .............. 365/189.05; 365/194; 365/230.06; 365/230.08; 327/261; 327/264
[58] Field of Search ........................... 307/272.1, 272.2; 365/230.06, 189.05, 194, 230.08; 327/261, 264

[56] References Cited

U.S. PATENT DOCUMENTS

| | | | |
|---|---|---|---|
| 4,785,415 | 11/1988 | Karlquist | 364/900 |
| 4,821,226 | 4/1989 | Christopher et al. | 364/900 |
| 4,823,302 | 4/1989 | Christopher | 364/900 |
| 4,912,679 | 3/1990 | Shinoda et al. | 365/230.01 |
| 4,943,962 | 7/1990 | Imamiya | 365/230.08 |
| 4,984,204 | 1/1991 | Sato et al. | 365/189.11 |
| 4,984,208 | 1/1991 | Sawada et al. | 365/230.06 |
| 5,018,109 | 5/1991 | Shinoda et al. | 365/230.08 |
| 5,053,652 | 10/1991 | Sato et al. | 307/530 |
| 5,058,051 | 10/1991 | Brooks | 364/900 |
| 5,093,809 | 3/1992 | Schmitt-Landsiedel et al. | 365/230.03 |
| 5,107,465 | 4/1992 | Fung et al. | 365/230.06 |
| 5,126,975 | 6/1992 | Handy et al. | 365/230.01 |
| 5,140,688 | 8/1992 | White et al. | 395/550 |
| 5,233,638 | 8/1993 | Moriwaki et al. | 307/272.2 |
| 5,295,115 | 3/1994 | Furuya | 365/230.06 |
| 5,305,282 | 4/1994 | Choi | 365/230.08 |

OTHER PUBLICATIONS

"Self-Timed Pipelined Static RAMs", *CMOS Data Book*. 1988: Cypress Semiconductor Corporation, pp. 2–83.

*Primary Examiner*—David C. Nelms
*Assistant Examiner*—Son Mai
*Attorney, Agent, or Firm*—Skjerven, Morrill MacPherson, Franklin & Friel; Norman R. Klivans

[57] ABSTRACT

A synchronous SRAM (or DRAM or other logic) chip with input registers (or latches) associated with the chip memory cell array input lines, where there is logic associated with the registers, locates the logic gates upstream of the registers and connected to the D input of each register. Hence the logic gates not only provide the needed logic function, but also provide the necessary delay to meet the specified hold time delay in synchronous circuits. This reduces the logic function after the input registers and hence improves the clock-to-output access time of the chip.

9 Claims, 7 Drawing Sheets setup time = $t_S$
hold time = $t_H$ 5,493,530

RAM WITH PRE-INPUT REGISTER LOGIC

This application is a continuation of application Ser. No. 08/112,409, filed Aug. 26, 1993 now abandoned.

BACKGROUND OF THE INVENTION

1. Field of the Invention

This invention is directed to integrated circuits and more specifically to the input registers associated with static random access memory, dynamic random access memory, and logic integrated circuits.

2. Description of the Prior Art

Static random access memory (SRAM) is well known as a volatile type of memory. In the past, SRAM typically had an asynchronous architecture, i.e., at any one time when a new set of memory addresses is supplied to the SRAM, the information stored in the SRAM memory cells appears at the output after a finite (access) time has elapsed. However, the increased speed of central processor units associated with computers which typically use SRAM has generated a need for high speed SRAM.

One well known way to increase effective SRAM speed in a system is to incorporate registers at the address lines, control lines, and data lines of the SRAM memory cell array input, and/or at the data output line of the SRAM memory cell array.

An SRAM chip is shown in a block diagram in FIG. 1, including the actual memory cell RAM array 10 (here depicted as a 16K×4 cell array) having an associated Data In register 12, an Address register 14, and a Data Out register 16. There are 14 address bits A0 through A13 and four data in bits DI0 through DI3, with the corresponding four data out bits DO0 through DO3. The other elements are conventional. This particular block diagram is of the Cypress Semiconductor CY7C158 SRAM chip. This is a fully registered (pipelined) high performance SRAM organized with 16,384 words by 4 bits. The asynchronous output enable signal $\overline{OE}$ is provided to control the three state data outputs.

The operation of such SRAM chips is completely synchronous, with the exception of the $\overline{OE}$ signal. All data, address and control signals are sampled on each low-to-high transition of the clock signal. When signal $\overline{CE}$ is LOW during this transition, the device is selected for operation. The type of operation is determined by the state of the WE signal during this same transition. Signal $\overline{WE}$ LOW causes a write operation, while $\overline{WE}$ HIGH causes a read operation. The Data Input and Data Output as well as Address register are also loaded on each low-to-high transition of the clock. The outputs, however, are not available until the next cycle after the address is loaded on the current cycle. The state of the outputs is controlled by the pipeline signals $\overline{CE}$ and WE and data from the previous cycle and the state of the $\overline{OE}$ signal.

An SRAM such as that shown in FIG. 1 with integrated registers has the clock line CLOCK provided to the chip, and most of the other input and output lines as shown timed against the signals on the clock line. In this case the clock line is connected to the Address register 14, Data In register 12, Data Out register 16, and registers 18 and 20. Thus most of the input and/or output lines are synchronized to the clock line signal. Therefore this is a synchronous SRAM.

For such synchronous SRAMs, the input lines (such as the address or control lines) must be stable, i.e. in a ready state, prior to the occurrence of a rising edge of the clock signal. This is because the rising edge of a clock signal causes the various registers to sample the values of the connected input lines. The finite time that the input lines are stable before the clock transition is called the setup time. Similarly, the input lines need to be stable for a finite time immediately after the occurrence of a rising edge of the clock signal. This second finite time is called the hold time. The setup time $t_S$ and hold time $t_H$ are illustrated in FIG. 2. The time periods prior to the setup time $t_S$, and following the hold time $t_H$, are labelled as "don't care", i.e. the state of the lines is not important. The clock signal rising edge is also indicated in FIG. 2.

One way to implement the input register so as to properly sample the inputs within the setup time and hold time constraints at the rising edge of the clock signal is a master-slave combination of latches, of the type shown in FIG. 3, including conventional master-slave D-type flip-flop register 30 which includes a master latch and a slave latch. Register 30 is timed by the clock signal provided at node 32 which is buffered by a TTL buffer 34. The data input to the register 30 is provided at input node 36 via TTL buffer 38. The output of register 30 is provided on line 40 at the Q output thereof.

For many applications the hold time $t_H$ is either 0 (measured in nanoseconds) or a very small time duration (such as 0.5 or 1 nanosecond). The delay due to the TTL buffer 38 in FIG. 3 may be shorter than the delay due to the TTL buffer 34 of the clock line under certain conditions (voltage, temperature, input transition and/or process variations).

In order to guarantee the hold time specification (for example 0.5 nanosecond) at the input register, it is necessary to compensate for the delay difference between TTL buffer 38 and TTL buffer 34 in FIG. 3 by including additional delay between the input line node 36 and the D terminal of register 30 of FIG. 3. Thus the correct data signal is sampled upon transition of the clock signal at node 32, even though the input line at node 32 changes its value immediately after the hold time delay. Note that this delay could be zero if the hold time is equal to zero.

Such additional needed delay is shown in FIG. 4 including additional delay elements (buffers) 42. Otherwise, FIG. 4 is similar to FIG. 3.

For a synchronous circuit, the access time from the clock rising edge to occurrence of a valid output data signal is a key parameter referred to as the clock to data output time ($t_{cd}$). A small clock to data output time is highly desirable for synchronous memory or synchronous logic performance. Any reduction of logic function between input register and output pad or between input register and the next register will reduce clock-to-data output delay.

FIG. 5 depicts circuitry additional to that of FIG. 4, including a master-slave register 50 having a D data input and a C clock input. In this case the clock signal input at node 52 is, as before, supplied via a buffer 54 to the clock input terminal C of register 50. Here there are two data input nodes, designated A0 (reference number 56) and A1 (reference number 58) each with an associated buffer 60, 62. Each input node 56, 58, is associated respectively with a register 50, 64. The outputs of registers 50 and 64 are provided to, in this case, NAND gate 66 and inverter 68 which together provide additional logic functions. Downstream of these additional logic functions are connected conventional inverters 70, 72. Each input node 56 and 58 has delay elements 76, 78 connected between it and the D input of the respective registers 50 and 64. Thus, in this case the SRAM input registers have associated logic functions for combining various inputs, for instance for address decoding.

It would be highly desirable to improve the performance of the circuit of FIG. 5 so as to allow faster functioning, i.e. less clock-to-data output delay.

SUMMARY OF THE INVENTION

In accordance with the invention, for an SRAM, DRAM (dynamic RAM) or any other logic circuit, the logic functions, i.e. the logic gates which in the prior art are connected downstream of the input register to provide a function such as full or partial decoding, are instead connected between the input pad terminal and the input register. Thus these logic gates provide the needed delay as well as the needed logic function. This allows the logic function to be performed during the needed delay period, which is prior to sampling of the value at the D data input terminal of the register by the clock line signal. This is contrary to the prior art practice of adding delay elements to meet the hold time requirements, with the delay elements being included between the input pad and the input register. In this way the clock-to-data output time is reduced significantly due to the reduction of logic function, by placing the logic function before the D data input terminal of the input register or latch. The invention is applicable to input latches as well as input registers.

DETAILED DESCRIPTION OF THE INVENTION

Figure 1:
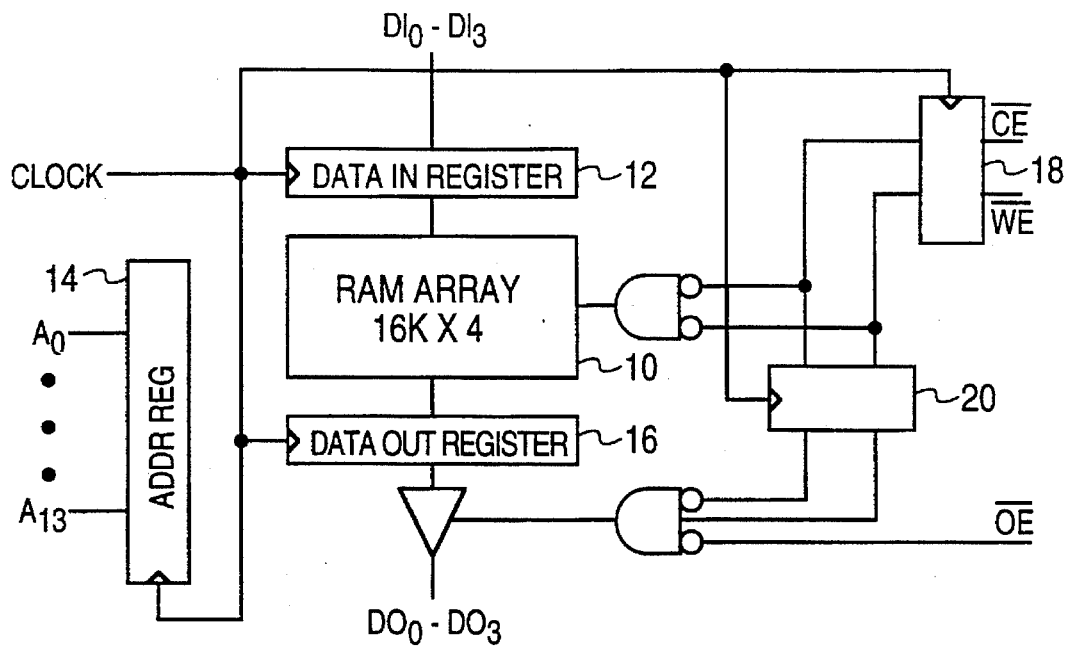
FIG. 1 shows a prior art SRAM chip in block diagram form.
Figure 2:
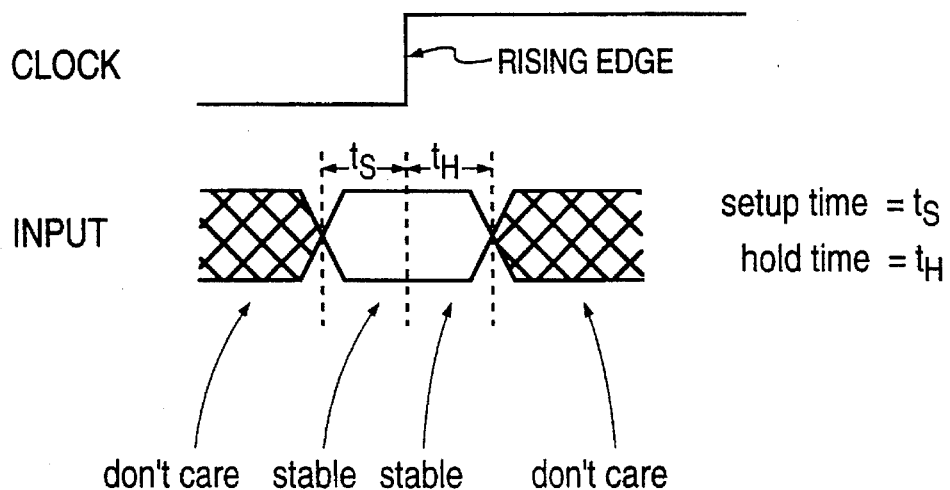
FIG. 2 is a timing diagram showing setup and hold times for an SRAM.
Figure 3:
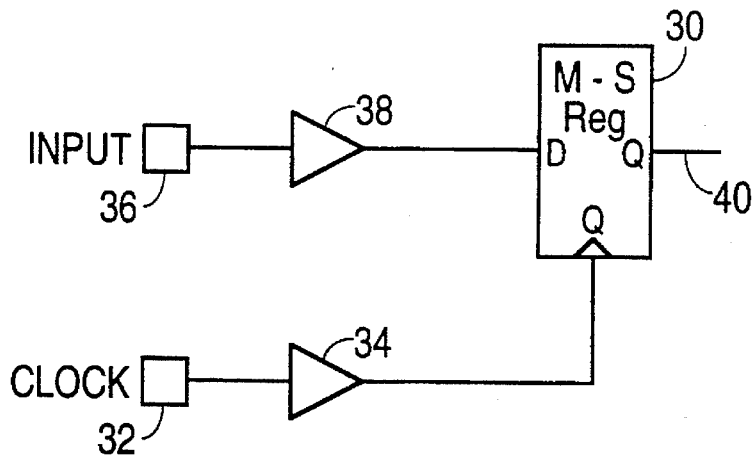
FIG. 3 shows a typical implementation of an integrated circuit with input register.
Figure 4:
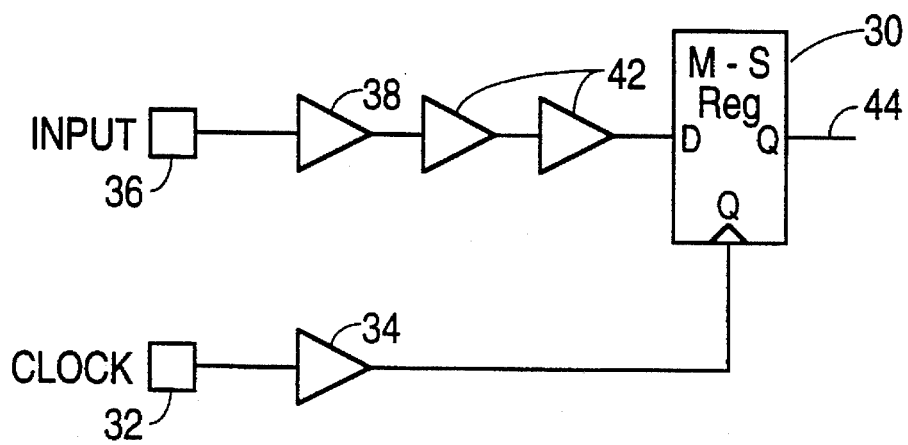
FIG. 4 shows an input register with delay elements included to meet hold time specification.
Figure 5:
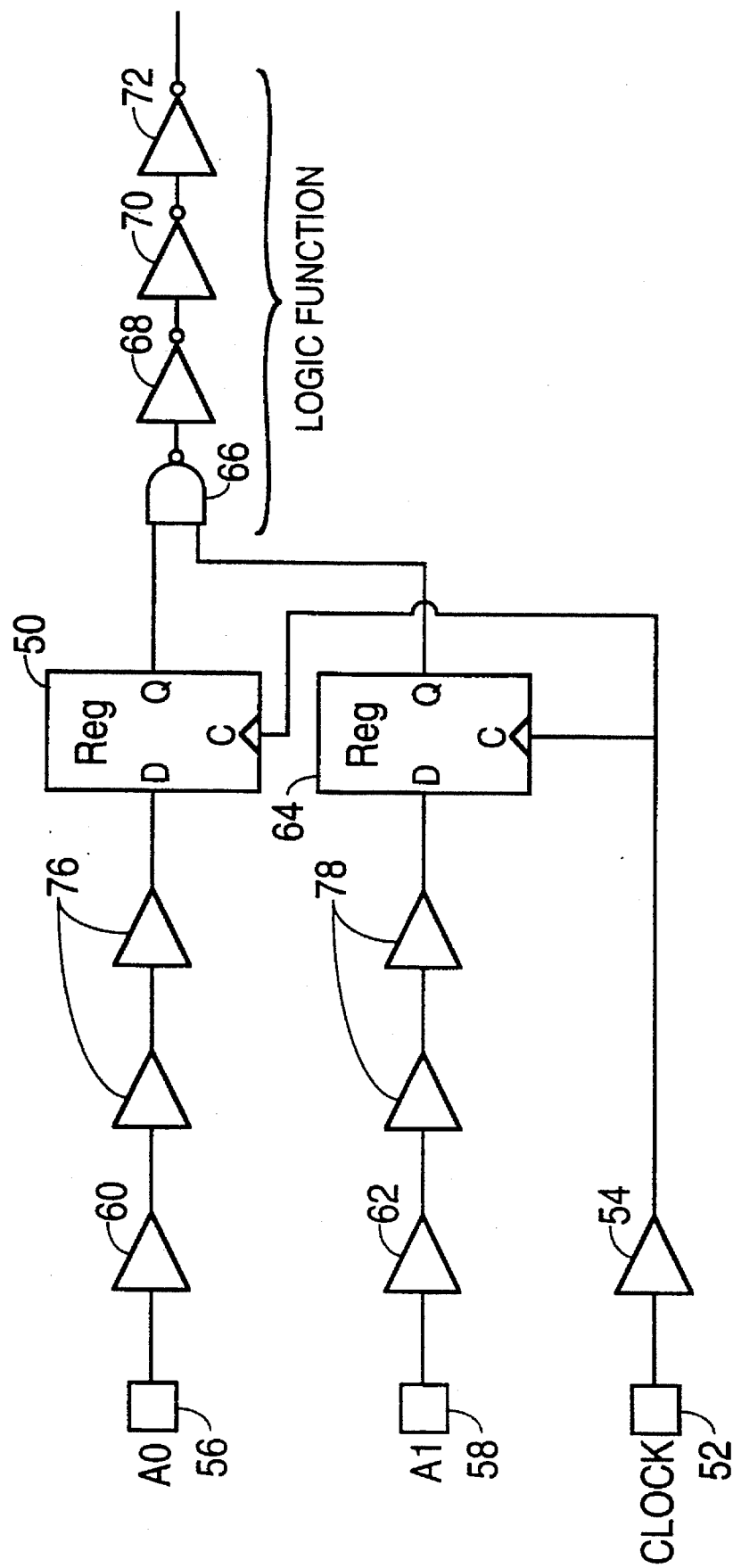
FIG. 5 shows a prior art input register with logic function following the register.
Figure 6:
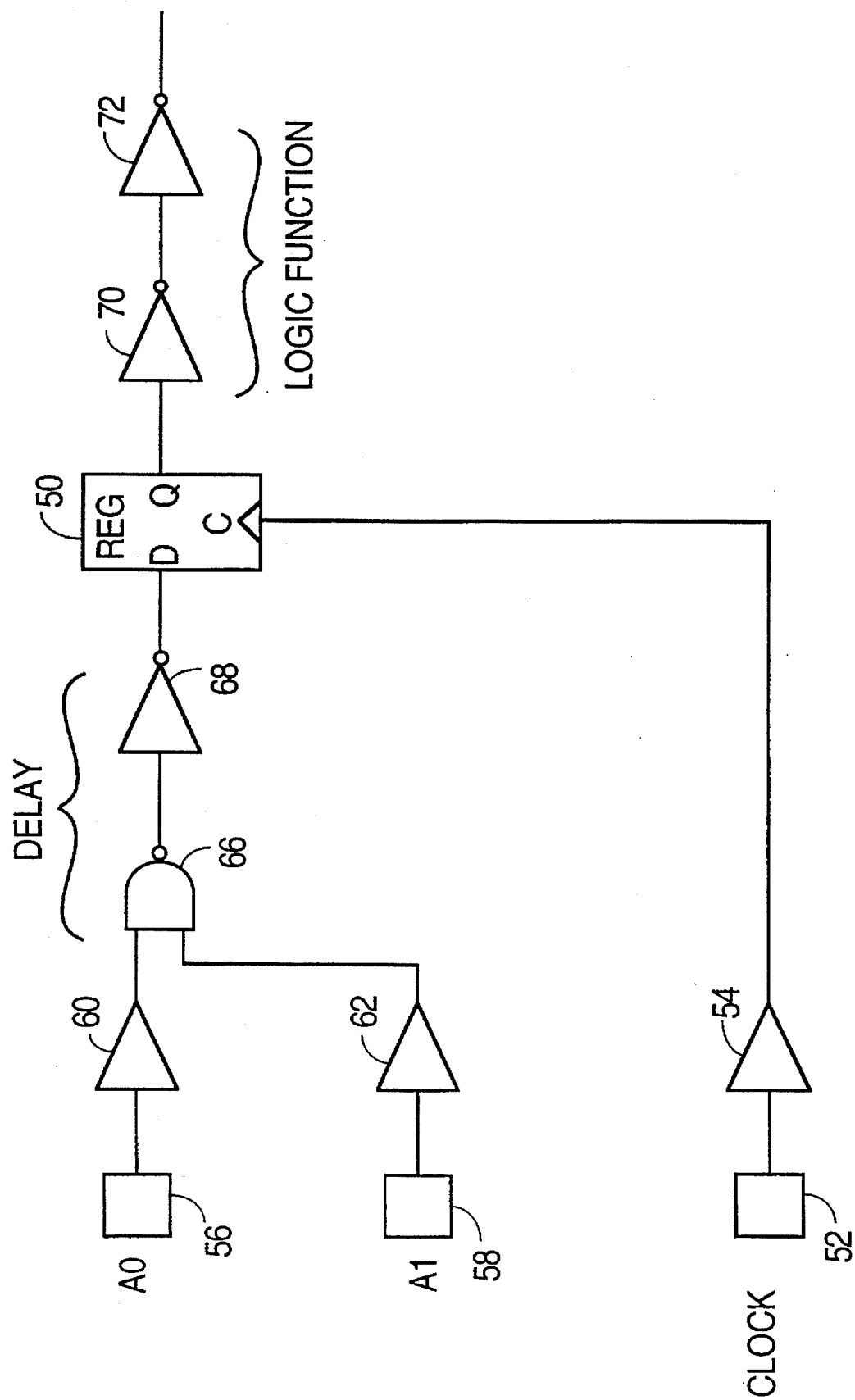
FIG. 6 shows an input register circuit in accordance with the invention.

FIG. 6 shows a register circuit in accordance with the invention. Most of the elements are identical to those of (prior art) FIG. 5. However, in this case the exemplary logic gates 66 and 68 are serially connected between the data input nodes A0, A1 (56 and 58) and the D input terminal of register 50. Thus the delay elements 76 and 78 in FIG. 5 are eliminated. The elimination of delay elements 76 and 78 and their replacement by the needed logic gates 66 and 68 improves the clock-to-data output time of the circuit by the amount of propagation delay through logic gates 66 and 68. Thereby, logic gates 66 and 68 provide the double function of ANDing the combination of the inputs of A0 and A1 and providing the necessary delay for synchronizing input register functioning.

Figure 7:
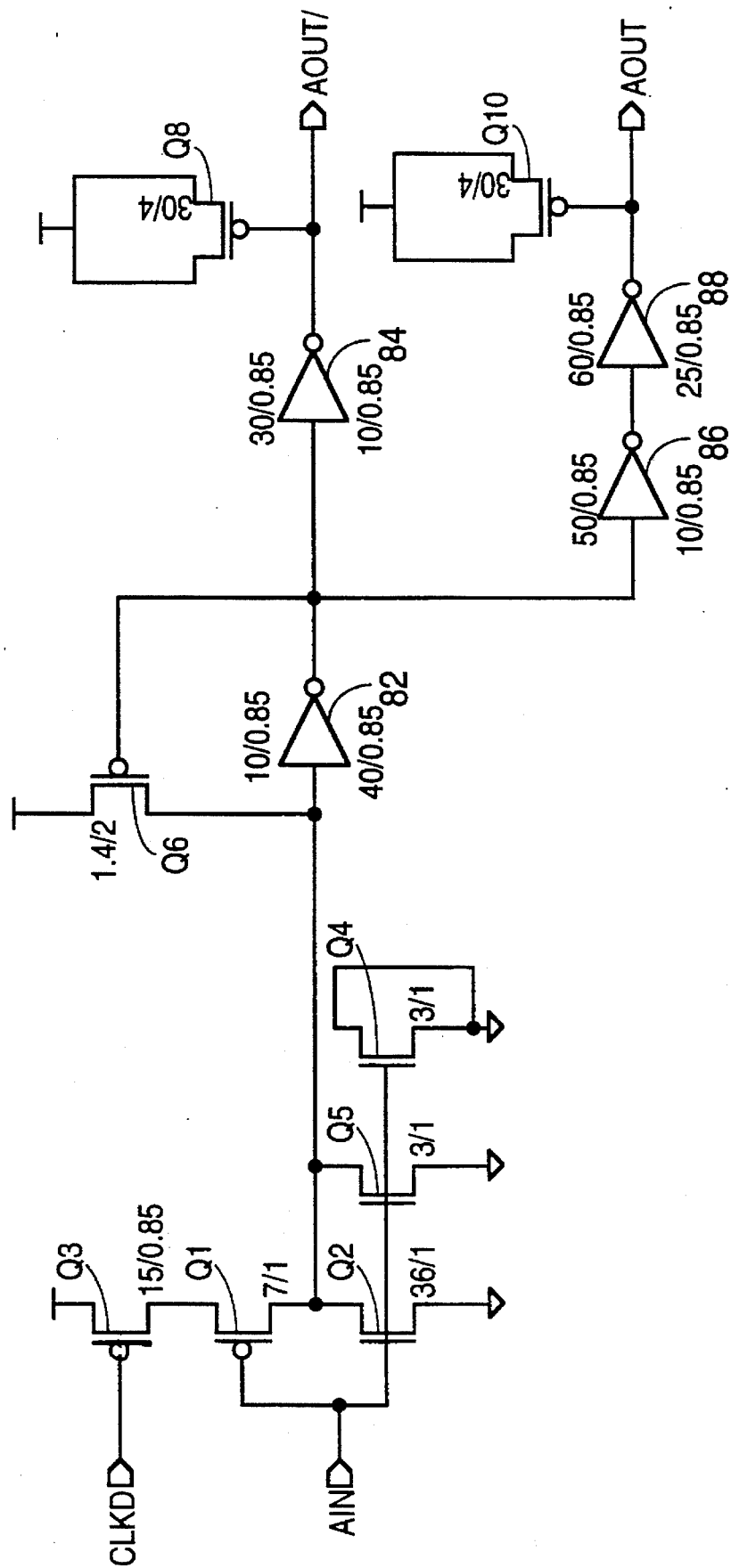
FIG. 7 shows an input address buffer in accordance with the invention.
Figure 8:
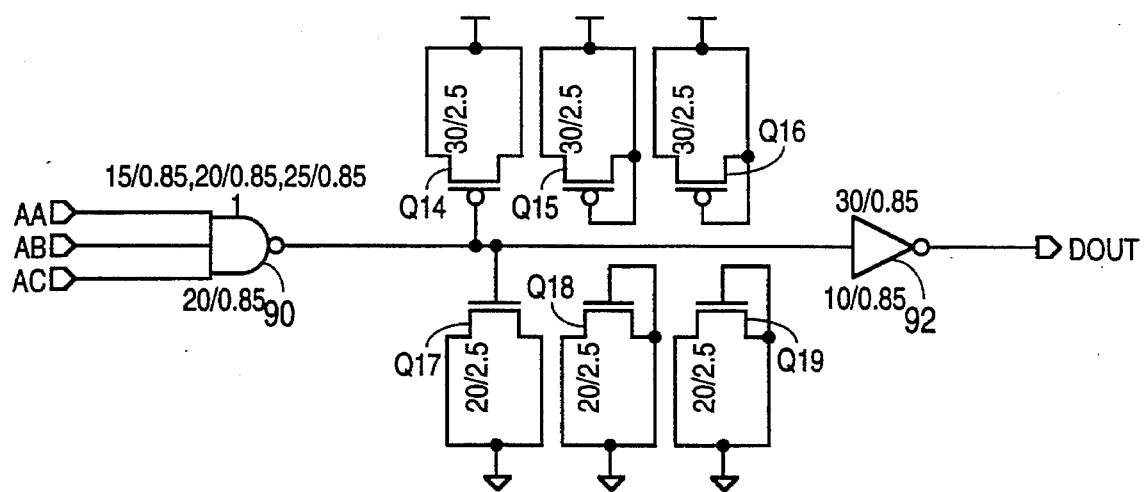
FIG. 8 shows detail of a circuit for address decoding in accordance with the invention.
Figure 9:
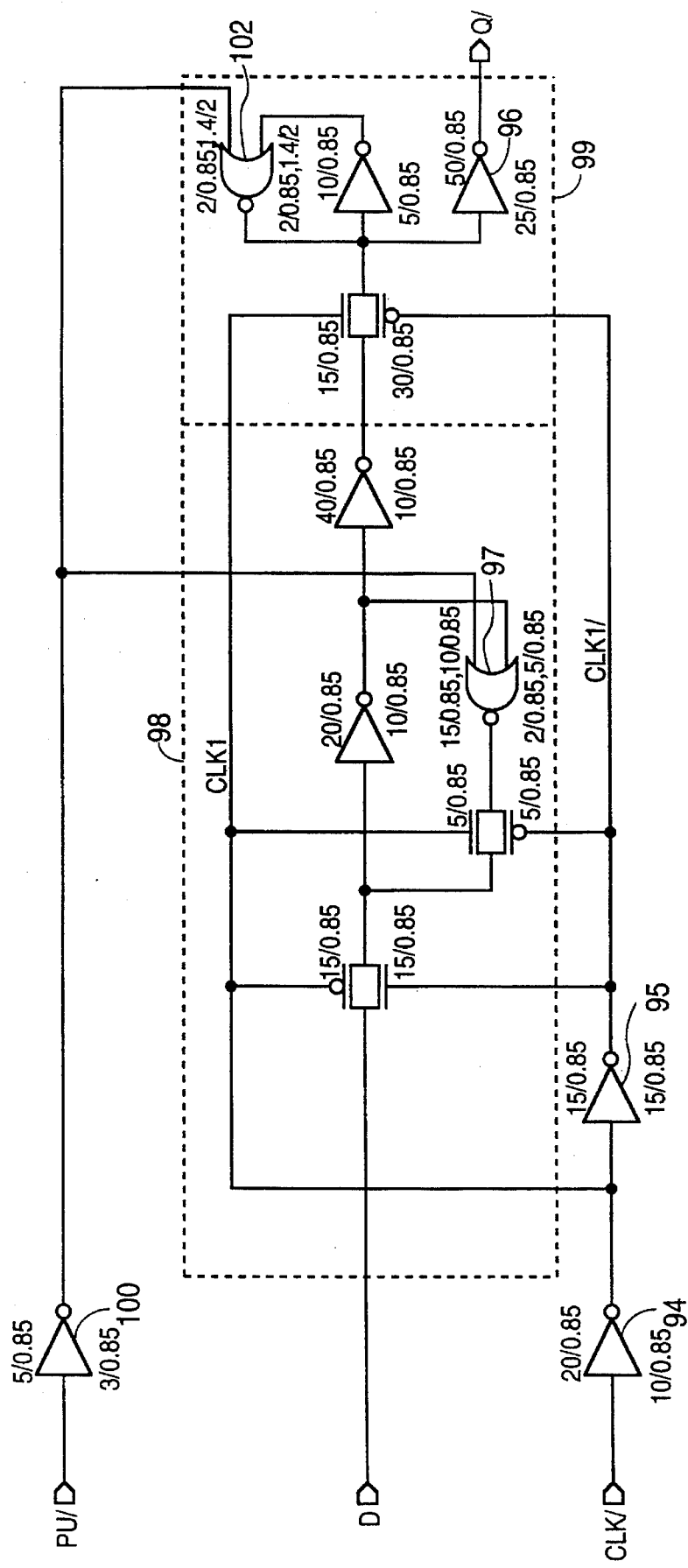
FIG. 9 shows detail of a register circuit in accordance with the invention.

FIGS. 7 to 9 show detail of circuitry in accordance with the invention. It is to be understood that these are a particular example, as is the circuitry of FIG. 6, and are not to be construed as limiting.

FIG. 7 is an input buffer which includes transistors Q1 to Q5 as a TTL buffer which is an interface to a CMOS circuit, in accordance with the invention, to outside (unshown) TTL logic. This circuit operates at CMOS voltage logic levels, and hence requires the TTL buffer to be compatible with TTL interface. The circuit of FIG. 7 receives a clock signal, which is a delayed clock signal designated CLKD, and also a data or address input signal designated AIN. The transistors Q1 to Q6 along with inverter 82 correspond to the input buffers 60 or 62 in FIG. 6. In this case, the CLKD signal is provided for power conservation purposes to operate the buffer as a gated inverter. The CLKD signal is delayed by a time equal to the amount of hold time, so that CLKD will be at a high logic level after the hold time requirement is met. Since the input buffer only needs to be functional between the setup time and hold time window at the clock low-to-high transition, the delayed clock signal CLKD is high after hold time delay and thus shuts off the buffer circuit of FIG. 7. The transistor Q6 is used to sustain any leakage current when CLKD stays high for a long time.

Hence, if the signal CLKD is low, the buffer circuit is active and functions as a conventional inverter. If the clock signal CLKD is high, then the buffer in FIG. 7 is nonfunctional, hence conserving power.

The numerals immediately adjacent each transistor or logic schematic symbol in FIG. 7 indicate the size of the transistor(s) in microns. The first number (in the pair of numbers, i.e. 7/1) indicates the transistor gate width, and the second number the transistor gate length. The operation of buffer FIG. 7 should be apparent, including the conventional inverter pair Q1, Q2 with the additional activation transistor Q3 which is operated by the CLKD signal. The transistors Q4 and Q5 are used to adjust the TTL buffer trigger level. In the version shown transistor Q5 is used and transistor Q4 is not used.

In FIG. 7, there are two branches after the TTL buffer, one providing the AOUT signal and the second providing the inverse thereof as AOUT/. Also provided are inverters 82, 84, 86, 88, the transistor gate lengths of which are as shown for each transistor in each inverter pair. Also provided is transistor Q8, connected to the AOUT/ terminal as a capacitor, and transistor Q10, connected to the AOUT terminal as a capacitor. Transistors Q8 and Q10 serve as capacitors to allow adjustment of the delay to match the output timing among all the input pads. These delay elements Q8, Q10 are provided because the data from the AOUT/ or AOUT terminals of all address input pads must reach the downstream decoders (shown in FIG. 8 as an example) preferably at the same time for better setup time and hold time control. In a typical chip, 15 or 20 such address buffers are on chip, to provide a 15 or 20 bit address. The transistors Q8 and Q10 when connected as shown in FIG. 7 provide additional delay. These transistors are connected when the chip is fabricated (not by the user). As an example, where there are 15 address buffers on a chip each similar to that of FIG. 7, assuming six buffers might have the longer delay time due to longer layout metal lines, then nine buffers might have the shorter delay time due to shorter layout metal lines. Therefore the AOUT/ and AOUT of the six address buffers with the longer delay time have the transistors Q8 and Q10 disconnected from them, and the AOUT/ and AOUT lines of the other nine address buffers with shorter delay time have the transistors Q8 and Q10 connected to them to increase the delay time, thereby matching those of the first six address buffers.

FIG. 8 shows one element of a multi-bit decoding circuit in accordance with the present invention, corresponding to the NAND gate 66 and inverter 68 of FIG. 6. However, in this case instead of there being two inputs A0 and A1, three input terminals are provided designated AA, AB and AC. Included in FIG. 8 is a three input NAND gate 90 and inverter 92, which form an element of the decoder. Eight such elements form a three-to-eight decoder. The inputs of the decoder, designated as AA, AB and AC, are connected to AOUT/ or AOUT of FIG. 7 from their respective input buffers. Also shown in FIG. 8 are transistors Q14 to Q19 used as capacitors providing input delay as needed (as determined by the chip designer). As shown, each transistor pair, i.e. Q14, Q17 or Q15, Q18 or Q16, Q19 is a P-channel and N-channel pair and is typically connected in tandem. In this case, one transistor pair Q14 and Q17 is connected and the other pairs, Q16 and Q19, and Q15 and Q18, are disconnected from the circuit. Alternatively, one could use a two-to-four decoder or four-to-sixteen decoder depending on the number of inputs terminals provided. (A circuit for two-to-four decoding is shown in FIG. 6 and three-to-eight decoding is shown in FIG. 8.) It is to be understood that partial or full decoding may be the logic function performed "upstream" of the register.

FIG. 9 shows a master-slave register circuit with power-up reset in accordance with the present invention, corresponding to the register 50 of FIG. 6 and to be connected to the DOUT terminal of FIG. 8. However, in this case instead of clock input C and register output Q, the inverted clock CLK/ and inverted register output Q/ (from inverter 96) are implemented. The master latch 98 and the slave latch 99 are shown in FIG. 9. The master-slave register is implemented in such a way that when the master latch 98 is transparent, the slave latch 99 stores the old data and when the master latch 98 stores the data, the slave latch 99 is transparent. The inverter 94 is connected to clock input signal CLK/ and generates signal CLK1, which connects to inverter 95 and generates signal CLK1/. The two signals CLK1 and CLK1/ control the states of the master 98 and slave 99 latches, being either transparent or storing the data.

An additional element in FIG. 9 is the power-up line PU/ which connects via inverter 100 to the master 98 and slave 99 latches, respectively. The master latch 98 is reset to logic 0 via NOR gate 97 and the slave latch 99 is reset to logic 0 via NOR gate 102 by power-up signal PU/, which is a one-shot negative-going pulse generated during power-up. Therefore, regardless of the logic state of clock input signal CLK/, the register is in a determined logic state, i.e. logic 0 in this case, after power-up. After power up, the power up line PU/ goes logic high, and thus has no impact on the master-slave register thereafter.

It is appreciated that the implementation in accordance with the present invention is not limited to address decoding but has other applications, i.e. for control lines, chip enable lines and other control logic for a registered SRAM, registered DRAM or registered logic circuits. Also, instead of a full register, the relevant data storage element may be a latch.

The above description is illustrative and not limiting; further modifications will be apparent to one of ordinary skill in the art in light of this disclosure, and are intended to fall within the scope of the appended claims.

We claim:

1. An input circuit for a registered integrated circuit chip, the integrated circuit chip including at least one master-slave latch for storing an input signal, the input circuit having a plurality of input terminals and an output terminal and comprising:

at least one logic gate having a plurality of input terminals and at least one output terminal, the input terminals of the logic gate being connected to the input terminals of the input circuit, the output terminal of the logic gate being connected to a data input terminal of the master-slave latch;

wherein a master portion of the latch includes an inverter having its output terminal connected to a first input terminal of a NOR gate, an output terminal of the NOR gate being connected to an input terminal of the inverter; and a power up line being connected to a second input terminal of the NOR gate.

2. The input circuit of claim 1, wherein only one additional logic gate is connected directly to an output terminal of the master-slave latch, and that additional logic gate has only a single connected input terminal.

3. The input circuit of claim 1, further comprising at least one buffer connected between one of the input terminals of the logic gate and one of the input terminals of the input circuit.

4. The input circuit of claim 3, wherein the buffer comprises:

a buffer input terminal;

a clock input terminal; and a gated inverter having two input terminals connected respectively to the buffer input terminal and clock input terminal.

5. The input circuit of claim 4, wherein the buffer further comprises:

a first and a second output terminal; and two delay elements, each connectable to one of the output terminals.

6. A registered input circuit for an integrated circuit, comprising:

a logic gate having a plurality of input terminals for receiving input signals and providing an output signal at an output terminal;

a plurality of delay elements each selectively connectable to the output terminal of the logic gate wherein each delay element includes two transistors of opposite conductivity type each having a control terminal connectable to the output terminal of the logic gate; and a latch having an input terminal connected to the output terminal of the logic gate and having an output terminal.

7. The registered input circuit of claim 1, wherein the plurality of input terminals of the logic gate are connected to receive address signals for accessing particular addresses of the integrated circuit chip, and the logic gate is one element of an address decoder.

8. A method of operating an integrated circuit chip having master-slave latches associated with input signals to the integrated circuit chip, comprising the steps of:

providing at least one of the master-slave latches with a power-up control terminal;

resetting the at least one master-slave latch with a power-up signal supplied to the power-up control terminal;

providing at least one logic gate having a plurality of input terminals and having the input terminals connected to receive the input signals; and providing an output signal from the logic gate to an input terminal of the at least one master-slave latch.

9. The registered input circuit of claim 1, further comprising a pass gate connected between the input terminal of the inverter and the output terminal of the logic gate.

* * * * *